United States Patent
Shim et al.

(10) Patent No.: US 9,961,287 B2
(45) Date of Patent: May 1, 2018

(54) IMAGE SENSOR

(71) Applicant: Dongbu HiTek Co., Ltd., Bucheon-si (KR)

(72) Inventors: Hee Sung Shim, Gangneung-si (KR); Seong Min Lee, Seongnam-si (KR); Joo Ho Hwang, Seoul (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 0 days. days.

(21) Appl. No.: 15/293,122

(22) Filed: Oct. 13, 2016

(65) Prior Publication Data

US 2017/0214877 A1  Jul. 27, 2017

(30) Foreign Application Priority Data

Jan. 27, 2016 (KR) ........................ 10-2016-0009874

(51) Int. Cl.
| | |
|---|---|
| *H04N 5/374* | (2011.01) |
| *H01L 27/146* | (2006.01) |
| *H04N 5/347* | (2011.01) |
| *H04N 5/369* | (2011.01) |
| *H04N 5/3745* | (2011.01) |
| *H04N 5/378* | (2011.01) |

(52) U.S. Cl.
CPC ..... *H04N 5/3742* (2013.01); *H01L 27/14612* (2013.01); *H01L 27/14643* (2013.01); *H04N 5/347* (2013.01); *H04N 5/3698* (2013.01); *H04N 5/378* (2013.01); *H04N 5/37455* (2013.01)

(58) Field of Classification Search
None
See application file for complete search history.

(56) References Cited

U.S. PATENT DOCUMENTS

| | | | | |
|---|---|---|---|---|
| 9,137,452 | B2* | 9/2015 | Han | H04N 5/2353 |
| 2015/0326806 | A1* | 11/2015 | Moriwaka | H04N 5/3456 |
| | | | | 348/302 |
| 2016/0205332 | A1* | 7/2016 | Lee | H04N 5/378 |
| | | | | 348/241 |
| 2017/0195596 | A1* | 7/2017 | Vogelsang | H04N 5/35581 |

* cited by examiner

*Primary Examiner* — James Hannett
(74) *Attorney, Agent, or Firm* — Andrew D. Fortney; Central California IP Group, P.C.

(57) ABSTRACT

An image sensor includes a pixel array including a plurality of unit pixels in a matrix including rows and columns. The matrix being divided into a plurality of groups and each of the plurality of groups includes two or more different columns, a binning sampling unit configured to sample outputs of unit pixels in each of the plurality of groups and output binning sampling signals, and an analog-digital conversion block including first and second analog-digital conversion units corresponding to the columns. The first analog-digital conversion units convert the binning sampling signals. When the first analog-digital conversion units convert the binning sampling signals, the second analog-digital conversion units are turned off.

19 Claims, 17 Drawing Sheets

IMAGE SENSOR

CROSS REFERENCE TO RELATED APPLICATION

This application claims the benefit of Korean Patent Application No. 10-2016-0009874, filed on Jan. 27, 2016, which is hereby incorporated by reference as if fully set forth herein.

BACKGROUND OF THE INVENTION

Field of the Invention

Embodiments of the present invention relate to an image sensor.

Discussion of the Related Art

In an image sensor, and more particularly a complementary metal-oxide semiconductor (CMOS) image sensor, one frame may include an array of N×M unit pixels.

The image sensor may use a low resolution mode if the data processing speed needs to increase (e.g., a moving image mode). In the low resolution mode, all unit pixels do not output signals, but some unit pixels may output signals. The low resolution mode of the image sensor may be implemented using a subsampling mode and a binning mode.

SUMMARY OF THE INVENTION

Accordingly, embodiments of the present invention are directed to an image sensor capable of reducing power consumption of an analog-digital conversion block and increasing a frame rate.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose(s) of the embodiments, as embodied and broadly described herein, an image sensor may include a pixel array including a plurality of unit pixels in a matrix including rows and columns, the matrix being divided into a plurality of groups, each of the plurality of groups including two or more different columns, a binning sampling unit configured to sample outputs of unit pixels in each of the plurality of groups and output binning sampling signals (e.g., based on or according to the sampled outputs), and an analog-digital conversion block including a plurality of analog-digital conversion units corresponding to the columns, the analog-digital conversion units having first and second analog-digital conversion units, the analog-digital conversion units being configured to convert the binning sampling signals. When the first analog-digital conversion units convert the binning sampling signals, the second analog-digital conversion units are turned off.

Each of the plurality of groups may include two or more adjacent columns.

The plurality of groups may include first and second groups, and each of the first groups may include two or more adjacent odd-numbered columns, and each of the second groups may include two or more adjacent even-numbered columns.

The pixel array may include sensing lines connected to the binning sampling unit and each of the sensing lines is connected to a corresponding unit pixel in a corresponding one of the columns.

The binning sampling unit may include first switches configured to connect sensing lines corresponding to columns in each of the plurality of groups, and second switches between the sensing lines and the analog-digital conversion units.

The binning sampling unit may further include third switches between a ground voltage or a ground potential and nodes between the sensing lines and the analog-digital conversion units.

The image sensor may further include a selector configured to turn the first analog-digital conversion unit on and turn the second analog-digital conversion unit off.

The image sensor may further include a memory including a plurality of latches configured to store outputs of the analog-digital conversion units.

The image sensor may further include a column scanner configured to select first ones of the latches corresponding to the first analog-digital conversion units and read digital data in the selected first latches.

Each of the plurality of analog-digital conversion units may include a correlated double sampling unit configured to perform correlated double sampling, and an analog-digital converter configured to convert an output of the correlated double sampling unit, where the correlated double sampling unit and the analog-digital converter of each of the second analog-digital conversion units may be turned off.

According to another aspect of the present invention, an image sensor includes a pixel array including a plurality of unit pixels in a matrix including rows and columns, the matrix being divided into a plurality of groups, and each of the plurality of groups including two or more different columns, a binning sampling unit configured to sample outputs of unit pixels that belong to each of the plurality of groups and output binning sampling signals, an analog-digital conversion block including a plurality of analog-digital conversion units that correspond to the columns, the analog-digital conversion units comprising first analog-digital conversion units configured to convert the binning sampling signals, latches configured to store outputs of the plurality of analog-digital conversion units, and a column scanner configured to select first ones of the latches to store outputs of the first analog-digital conversion units and read digital data in the selected first latches.

Each of the plurality of groups may include two or more adjacent columns.

The plurality of groups may include first and second groups. Each of the first groups may include two or more adjacent odd-numbered columns and each of the second groups may include two or more adjacent even-numbered columns.

The column scanner may generate scan signals configured to select the first latches and sequentially read the data in the first latches in response to the scan signals.

Each of the unit pixels may include a photodiode, a floating diffusion area, a transfer transistor, a reset transistor, a drive transistor and a select transistor.

According to another aspect of the present invention, an image sensor includes a pixel array including a plurality of unit pixels in a matrix including rows and columns, sensing lines, and readout circuits between the plurality of unit pixels and the sensing lines, the matrix being divided into a plurality of groups, and each of the plurality of groups including two or more different columns, a binning sampling unit configured to sample outputs of unit pixels in each of the plurality of groups and output binning sampling signals, and an analog-digital conversion block including a plurality of analog-digital conversion units corresponding to the columns, the analog-digital conversion units comprising first analog-digital conversion units configured to convert the binning sampling signals. Each of the unit pixels includes a photodiode, a floating diffusion area and a transfer transistor between the photodiode and the floating diffusion area. The unit pixels in each column are grouped into a plurality of subgroups, and the floating diffusion areas of the unit pixels in each of the plurality of subgroups are connected to and shared between each other. The readout circuit connects the shared floating diffusion areas and a corresponding one of the sensing lines.

When the first analog-digital conversion units convert the binning sampling signals, the second analog-digital conversion units may be turned off.

The image sensor may further include latches configured to store outputs of the plurality of analog-digital conversion units and a column scanner configured to select first ones of the latches to store the outputs of the first analog-digital conversion units and read digital data in the selected first latches.

Each of the plurality of subgroups may include two or more adjacent unit pixels included in each column.

The plurality of subgroups may include first and second subgroups. Each of the first sub groups may include unit pixels of two or more adjacent odd-numbered rows of each column, and each of the second sub groups may include unit pixels of two or more adjacent even-numbered rows of each column.

According to one or more embodiments of the present invention, it is possible to reduce power consumption of the analog-digital conversion block and increase a frame rate of the image sensor.

It is to be understood that both the foregoing general description and the following detailed description of embodiments are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
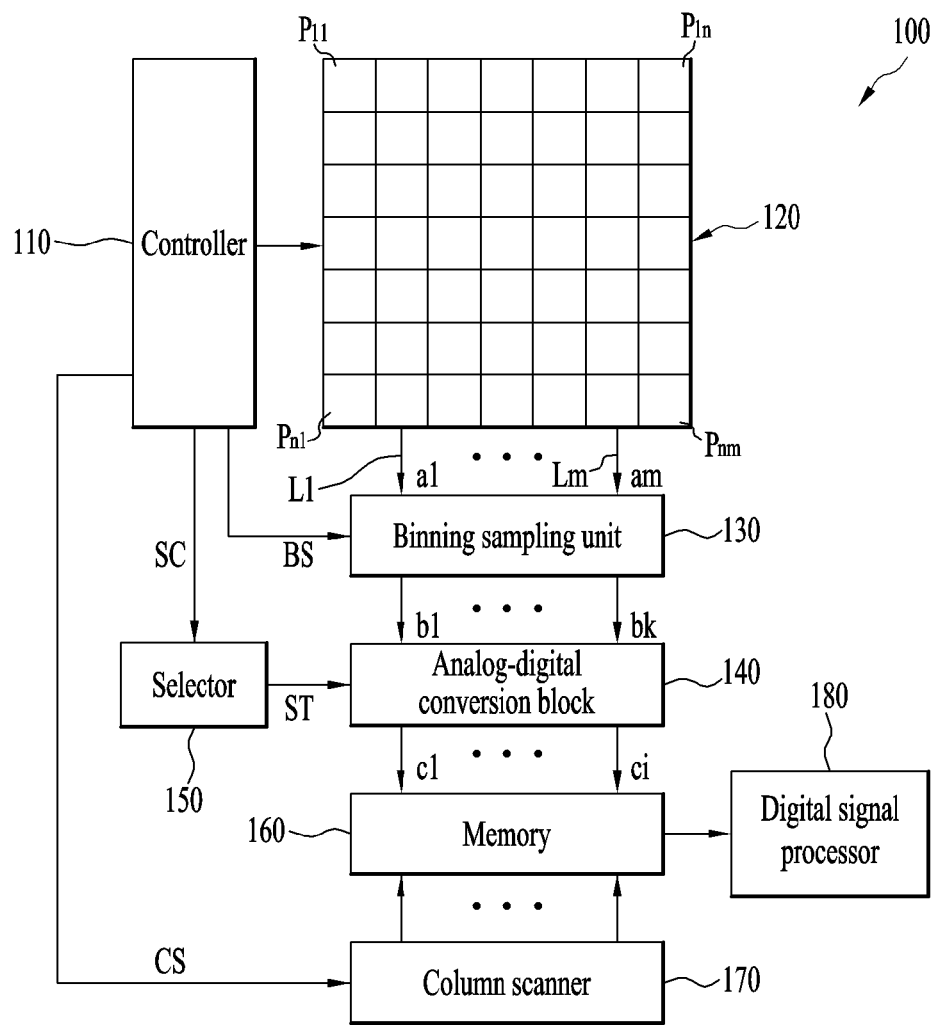
FIG. 1 is diagram showing a configuration of an exemplary image sensor according to embodiments of the invention.

Hereinafter, the embodiments will be clearly appreciated through the accompanying drawings and the following description thereof. In description of the embodiments, it will be understood that, when an element such as a layer, film, region, pattern or structure is referred to as being formed "on" or "under" another element, such as a substrate, layer, film, region, pad or pattern, it can be directly "on" or "under" the other element or be indirectly formed with intervening elements therebetween. It will also be understood that "on" and "under" the element is described relative to the drawings. In addition, the same reference numerals designate the same constituent elements throughout the description of the drawings.

Figure 2:
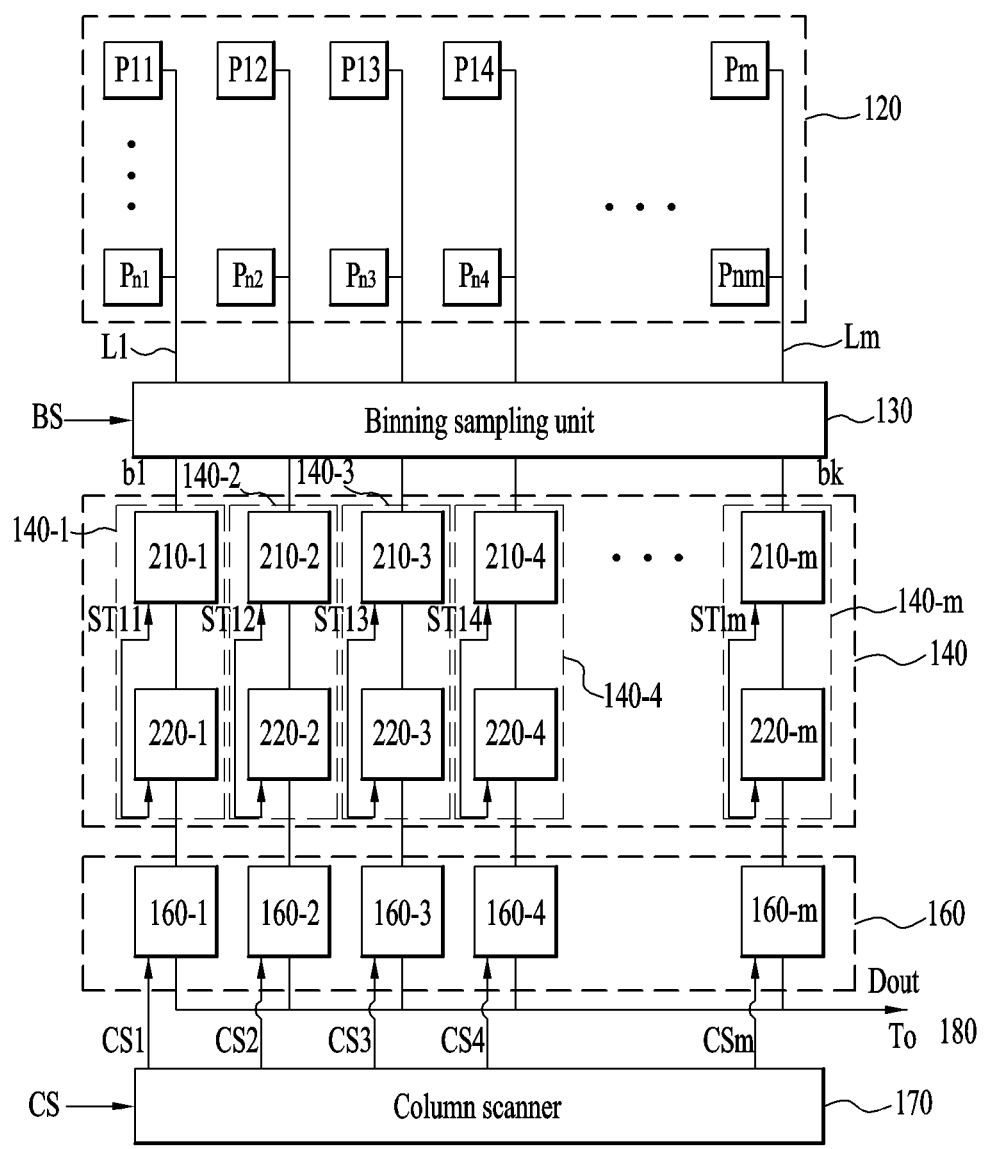
FIG. 2 is a diagram showing one or more embodiments of a pixel array unit, an analog-digital conversion block and a memory as shown in FIG. 1.

FIG. 1 is diagram showing a configuration of an exemplary image sensor 100 according to one or more embodiments, and FIG. 2 is a diagram showing one or more embodiments of the pixel array 120, the analog-digital conversion block 149 and the memory 160 shown in FIG. 1.

Referring to FIGS. 1 and 2, the exemplary image sensor 100 includes a controller 110, a pixel array unit 120, a binning sampling unit 130, an analog-digital conversion block 140, a selector 150, a memory 160 and a column scanner 170. In addition, the image sensor 100 may further include a digital signal processor 180.

The controller 110 outputs a first control signal (e.g., a reset signal RX, a transmission signal TX, a selection signal SX) configured to control the pixel array 120, a second control signal (e.g., BS) configured to control the binning sampling unit 130, a third control signal (e.g., SC) configured to control the selector 150, and a fourth signal (e.g., CS) configured to control the column scanner 170.

For example, the controller 110 may include a timing controller configured to generate a timing signal and/or a control signal. In addition, the controller 110 may include a row driver configured to generate a first control signal for driving a plurality of unit pixels (e.g., in a row of the pixel array) based on the timing signal provided by the timing controller.

The pixel array 120 may include a plurality of unit pixels P11 to Pnm (n and m being natural numbers greater than 1), and the plurality of unit pixels P11 to Pnm may be arranged in a matrix including rows and columns. Each of the unit pixels P11 to Pnm may comprise a photoelectric transformation element configured to sense light and transform the sensed light into an electric signal.

The pixel array 120 may include sensing lines L1 to Lm (m being a natural number greater than 1) connected to the unit pixels P11 to Pnm. The pixel array 120 outputs sensing signals a1 to am (m being a natural number greater than 1) on the sensing lines L1 to Lm. For example, each of the sensing lines L1 to Lm may be connected to each of the output terminals of the unit pixels P11 to Pnm in a corresponding one of the columns.

The binning sampling unit 130 receives outputs of two or more unit pixels from among the unit pixels P11 to Pnm connected to the sensing lines L1 to Lm and outputs binning sampling signals b1 to bk (e.g., $1 \leq k \leq m$) based on a second control signal BS. At this time, the binning sampling signals b1 to bk may be a sum or average of the outputs of the selected two or more unit pixels, without being limited thereto.

For example, the binning sampling unit 130 may sample outputs of the unit pixels belonging to two or more different columns and output binning sampling signals b1 to bk (e.g., $1 \leq k \leq m$) according to the sampled outputs.

The unit pixels belonging to two or more different columns may have identical exposure times. Here, the exposure time may be a period from reset operation of a photodiode in a unit pixel to the transmission of charges generated by the light received by the photodiode to a floating diffusion area of the unit pixel.

For example, the binning sampling unit 130 may sample outputs of two or more sensing lines from among the sensing lines L1 to Lm and output the binning sampling signals b1 to bk according to the sampled outputs.

The pixel array may be divided into a plurality of groups, and each of the plurality of groups may include two or more different columns. The columns in each group may not overlap each other.

For example, the groups may include two or more adjacent columns. Alternatively, the groups may include first and second groups.

The first group may include two or more adjacent odd-numbered columns, and the second group may include two or more adjacent even-numbered columns.

The analog-digital conversion block 140 converts the analog binning sampling signals b1 to bk to digital signals. The binning sampling signals b1 to bk are analog signals output from the binning sampling unit 130, and the analog-digital conversion block 140 outputs digital signals C1 to Ci (i being a natural number greater than 1) according to the conversion, based on a selection signal ST.

The analog-digital conversion block 140 may include a plurality of analog-digital conversion units 140-1 to 140-*m* (FIG. 2).

The plurality of analog-digital conversion units 140-1 to 140-*m* may include (i) correlated double sampling units 210-1 to 210-*m* configured to perform correlated double sampling in order to reduce or cancel any fixed pattern noise (e.g., unique fixed pattern noise from the pixels) and (ii) analog-digital converters 220-1 to 220-*m* convert the analog outputs of the correlated double sampling units 210-1 to 210-*m* to digital signals (e.g., C1 to Ci).

The plurality of analog-digital conversion units 140-1 to 140-*m* may correspond to the sensing lines L1 to Lm (e.g., in a 1:1 relationship). For example, each of the plurality of analog-digital conversion units 140-1 to 140-*m* may correspond to one of the sensing lines L1 to Lm.

The binning sampling signals b1 to bk may be selectively provided to k analog-digital conversion units from among the m analog-digital conversion units 140-1 to 140-*m*.

The selector 150 may output selection signals ST11 to ST1*m* configured to control the plurality of analog-digital conversion units 140-1 to 140-*m* based on the third control signal SC.

The plurality of analog-digital conversion units 140-1 to 140-*m* may selectively operate in response to the selection signals ST11 to ST1*m*. For example, based on the selection signals ST11 to ST1*m*, a group or set of first analog-digital conversion units (e.g., analog-digital conversion units 140-1, 140-3 . . . 140-*m*−1, where m is an even integer of 6 or more) may be turned on, and a group or set of second analog-digital conversion unit (e.g., analog-digital conversion units 140-2, 140-4 . . . 140-*m*) may be turned off.

When the first analog-digital conversion units convert the binning sampling signals b1 to bk, the second analog-digital conversion units may be turned off.

For example, based on the selection signals ST11 to ST1*m*, an operating voltage may be supplied to the first analog-digital conversion units to turn the first analog-digital conversion units on, and the operating voltage or its complement may be supplied to the second analog-digital conversion units to turn the second analog-digital conversion units off.

Here, the binning sampling signals b1 to bk (e.g., active binning sampling signals) are supplied to the first analog-digital conversion units and the binning sampling signals b1 to bk (e.g., the active binning sampling signals) are not supplied to the second analog-digital conversion units.

Accordingly, the first analog-digital conversion units may output the digital signals C1 to Ci by performing an analog-digital conversion on the binning sampling signals.

Since not all of the analog-digital conversion units 140-1 to 140-*m* are operative, and only the first analog-digital conversion units to which the (active) binning sampling signals b1 to bk are supplied are operative, the embodiments can reduce power consumption of the analog-digital conversion block.

The memory 160 may store outputs of the analog-digital conversion units 140-1 to 140-*m* and read and/or output the digital signals C1 to Ci to the digital signal processor 180 in response to the control signals CS1 to CSm of the column scanner 170.

The memory 160 may include a plurality of latches 160-1 to 160-*m* or a plurality of capacitors (e.g., one transistor-one capacitor memory cells such as those commonly found in dynamic random access memories [DRAMs]). The plurality of latches 160-1 to 160-$m$ or the plurality of capacitors correspond to the plurality of analog-digital conversion units 140-1 to 140-$m$.

For example, each of the plurality of latches 160-1 to 160-$m$ may store a corresponding one of the outputs of the plurality of analog-digital conversion units 140-1 to 140-$m$.

In a further example, first ones of the plurality of latches 160-1 to 160-$m$ may correspond to the first analog-digital conversion units, and second ones of the plurality of latches 160-1 to 160-$m$ may correspond to the second analog-digital conversion units.

The column scanner 170 may output control signals CS1 to CSm configured to control the memory 160 based on the fourth control signal CS received from the controller 110.

The column scanner 170 may generate the control signals CS1 to CSm to select and read the first latches storing the digital signals C1 to Ci.

The first latches storing the digital signals C1 to Ci may be selected from among the plurality of latches 160-1 to 160-$m$ of the memory 160 by the first control signals CS1 to CSm. Data stored in the first latch may be sequentially read in response to a clock signal CLK (see, e.g., FIG. 7) from the controller 110 and may be transmitted to the digital signal processor 180.

Since the column scanner 170 does not read all the plurality of latches 160-1 to 160-$m$ of the memory 16, but rather sequentially reads only the digital signals C1 to Ci stored in the first latches, embodiments of the invention may improve the speed for reading the data stored in the memory 160 and thus can shorten the time to scan one row of the pixel array 120.

Figure 5:
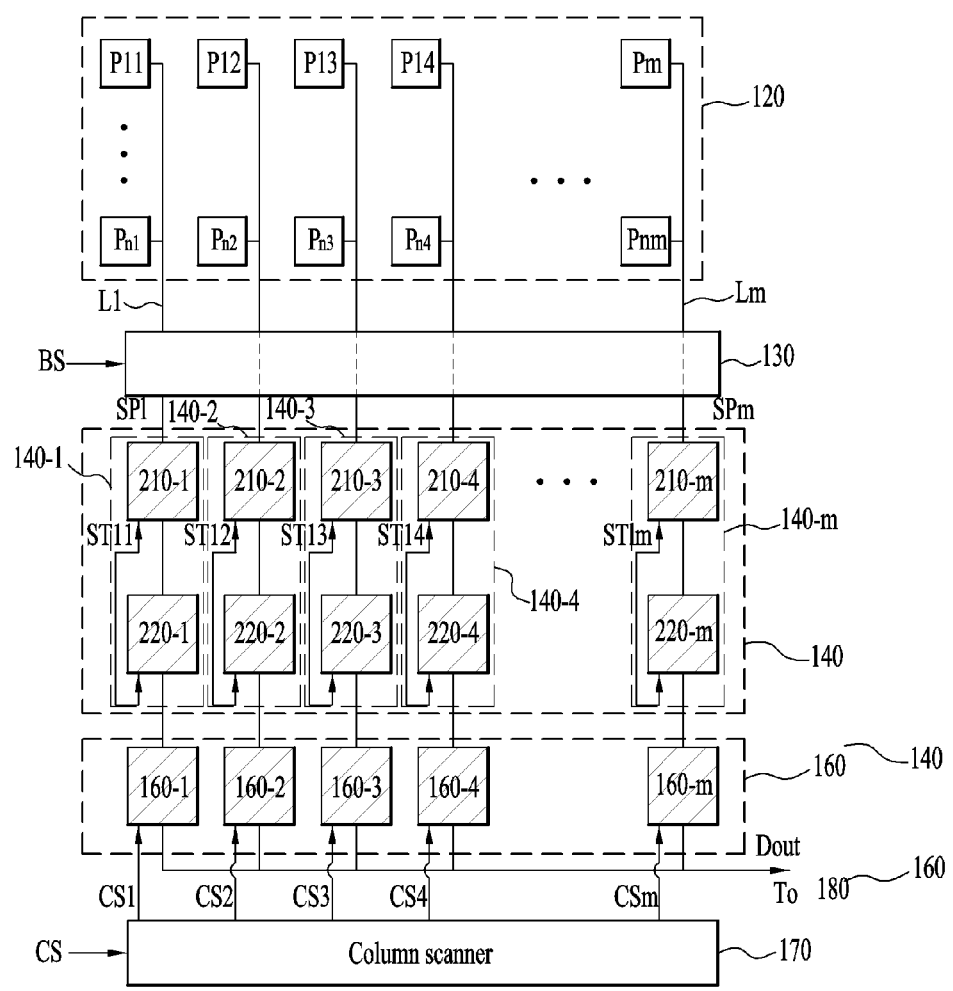
FIG. 5 is a diagram showing an operation according to another embodiment of the image sensor shown in FIG. 1.

In the process or operation shown in FIG. 5, the column scanner 170 may select all of the latches 160-1 to 160-$m$ and read the data stored in the latches 160-1 to 160-$m$.

The digital signal processor 180 processes the digital signals C1 to Ci received from the memory 160.

Figure 3:
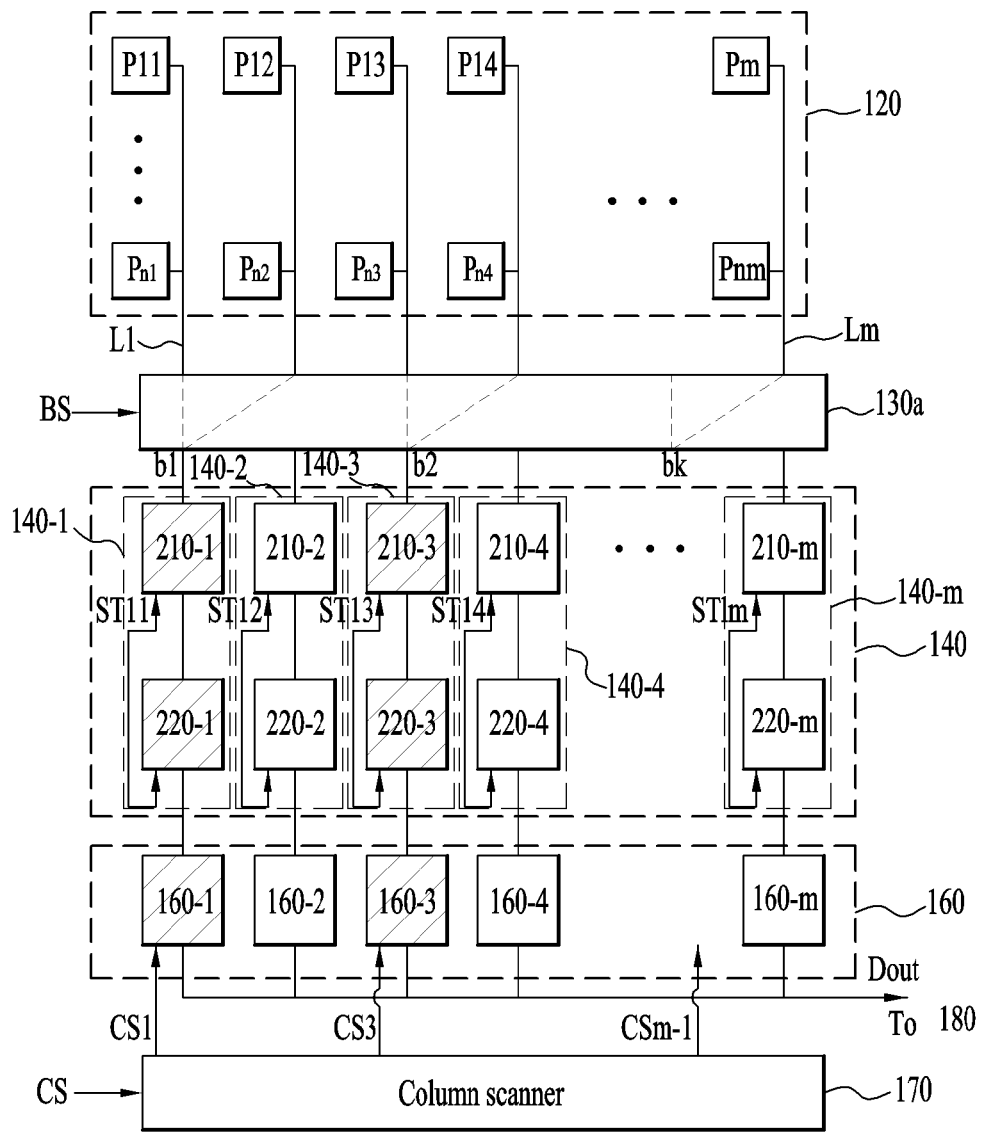
FIG. 3 is a diagram showing one or more operations according to one or more embodiments of the image sensor shown in FIG. 1.

FIG. 3 is a diagram showing a process or operation according to one or more embodiments of the image sensor shown in FIG. 1.

The same reference numerals as FIG. 2 indicate the same components in FIG. 3, which will be described briefly or omitted.

For example, FIG. 3 may show a monochrome type image sensor for sensing a grayscale image.

Referring to FIG. 3, the binning sampling unit 130$a$ may sample outputs of the unit pixels belonging to two adjacent columns and output binning sampling signals b1 to bk (e.g., 1≤k≤m) according to the sampled outputs and/or based on a second control signal BS.

For example, the binning sampling unit 130$a$ may include a plurality of switches and a plurality of capacitors. The second control signal BS may be a signal for controlling the plurality of switches. In addition, the binning sampling unit 130$a$ may further include at least one resistor.

The binning sampling signals b1 to bk (e.g., 1≤k≤m) may be provided to first analog-digital conversion unit 140-1 to 140-($m$−1) among the plurality of analog-digital conversion units 140-1 to 140-$m$. For example, the first analog-digital conversion units may include one or more odd-numbered analog-digital conversion units corresponding to the odd-numbered sensing lines, without being limited thereto.

Based on the selection signals ST11 to ST1$m$ received from the selector 150, a voltage or active signal is supplied to the first (e.g., odd-numbered) analog-digital conversion units 140-1 to 140-($m$−1) to turn on the first analog-digital conversion units 140-1 to 140-($m$−1), whereas the voltage or active signal is not supplied to the remaining (e.g., even-numbered) analog-digital conversion units 140-2 to 140-$m$ to turn off the remaining analog-digital conversion units 140-2 to 140-$m$.

Alternatively, based on the selection signals ST11 to ST1$m$ received from the selector 150, a bias current is supplied to first analog-digital conversion units 140-1 to 140-($m$−1) to turn on the first analog-digital conversion units 140-1 to 140-($m$−1), whereas the bias current is not supplied to the remaining analog-digital conversion units 140-2 to 140-$m$ to turn off the remaining analog-digital conversion units 140-2 to 140-$m$.

For example, based on the selection signals ST11 to ST1$m$, the first correlated double sampling units 210-1 to 210-($m$−1) and the first analog-digital conversion units 220-1 to 220-($m$−1) of the first analog-digital conversion units 140-1 to 140-($m$−1) may all be turned on. In addition, the second correlated double sampling units 210-2 to 210-$m$ and the second analog-digital conversion units 220-2 to 220-$m$ of the second analog-digital conversion units 140-2 to 140-$m$ may all be turned off. Therefore, according to one or more embodiments, it is possible to reduce power consumption.

The outputs of the first analog-digital conversion units 140-1 to 140-($m$−1) may be stored in first latches 160-1 to 160-($m$−1) corresponding to the first analog-digital conversion units 140-1 to 140-($m$−1) among the latches 160-1 to 160-$m$ of the memory 160.

The column scanner 170 may generate scan signals CS1 to CS-($m$−1) for selecting first latches to be read from among the latches 160-1 to 160-$m$ of the memory 160.

In response to the scan signals CS1 to CS-($m$−1), data stored in the first latches 160-1 to 160-($m$−1) may be sequentially read.

Figure 7:
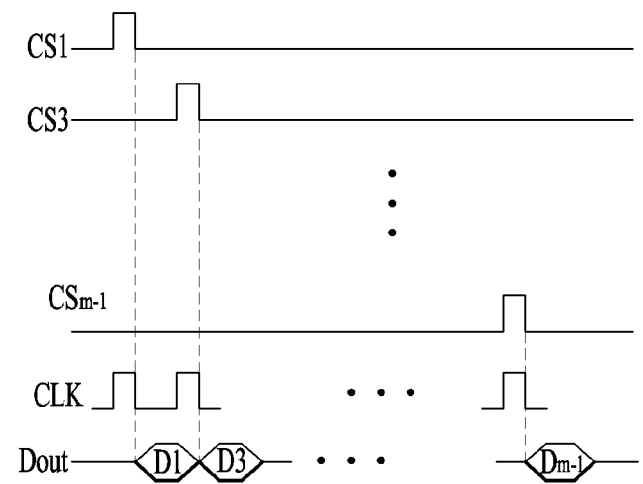
FIG. 7 is a timing diagram of scan signals generated by an exemplary column scanner as shown in FIG. 3.

FIG. 7 is a timing chart of scan signals CS1 to CS-($m$−1) generated by an exemplary column scanner 170 as shown in FIG. 3.

Referring to FIG. 7, the column scanner 170 may generate scan signals CS1 to CSm−1 for reading first latches 160-1 to 160-($m$−1) (e.g., odd-numbered latches) in response to a clock signal CLK. In response to the scan signals CS1 to CSm−1, data D1 to Dm−1 stored in the first latches are sequentially transmitted to the digital signal processor 180. When such data transmission is completed, a scan of one row of the pixel array 120 may be completed.

Since only the odd-numbered latches of the memory 160 corresponding to one row of the pixel array 120 are read, it may be possible to reduce the time to scan one row by half and to correspondingly increase the frame rate of the image sensor.

Figure 4:
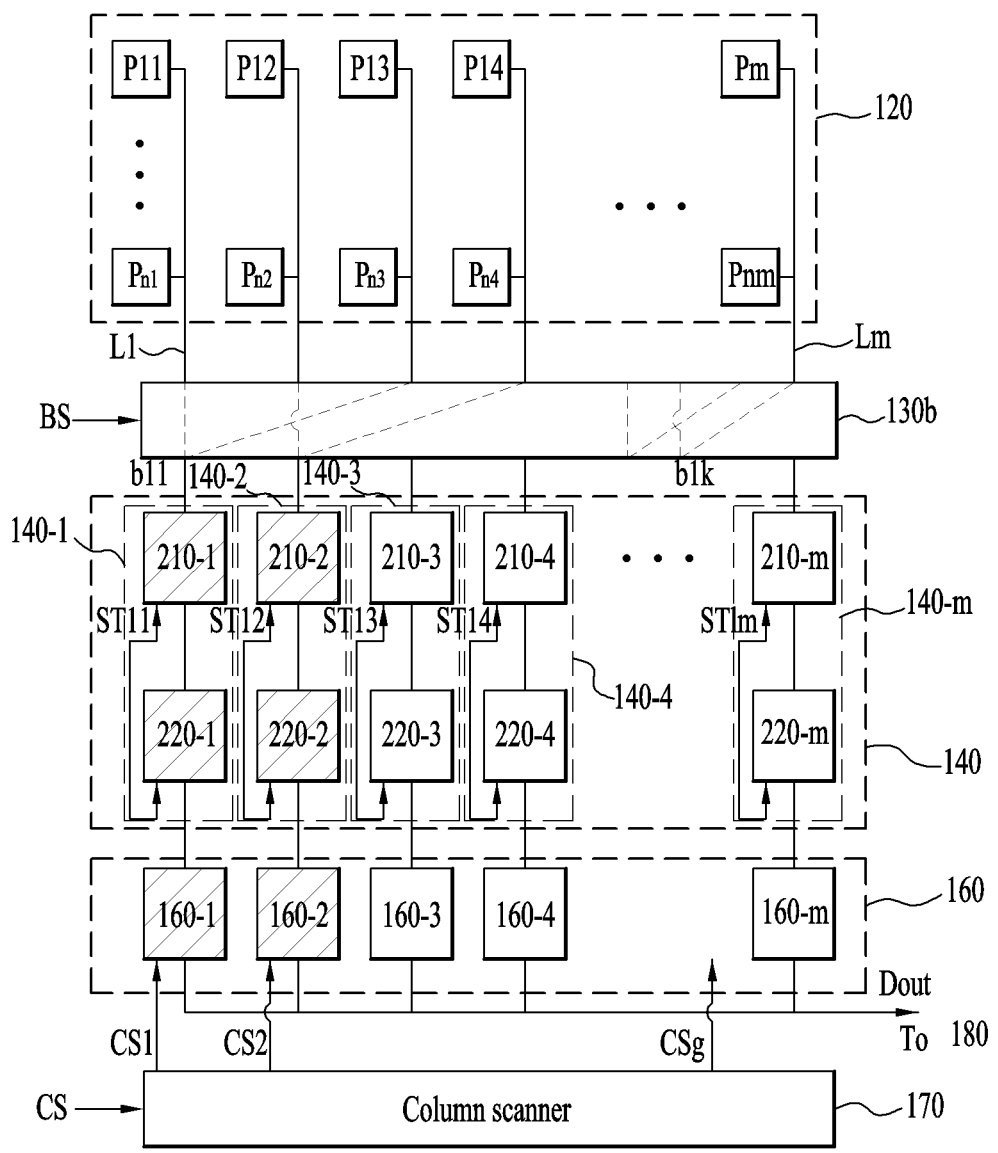
FIG. 4 is a diagram showing one or more operations according to other embodiments of the image sensor shown in FIG. 1.

FIG. 4 is a diagram showing a process or operation according to one or more other embodiments of the image sensor shown in FIG. 1.

The same reference numerals as in FIG. 2 indicate the same components in FIG. 4, which will be described briefly or omitted.

For example, the embodiment(s) of FIG. 4 may relate to a Bayer-type image sensor for sensing a color (e.g., RGB) image.

Referring to FIG. 4, the binning sampling unit 130$b$ may sample outputs of unit pixels belonging to two adjacent odd-numbered columns of the pixel array 120, and output first binning sampling signals b11 to b1($k$−1) according to the sampled outputs based on a second control signal BS. In addition, the binning sampling unit 130$b$ may sample outputs of unit pixels belonging to two adjacent even-numbered columns of the pixel array 120, and output first binning sampling signals b12 to b1k (e.g., 1≤k≤m) according to the sampled based on the second control signal BS.

The binning sampling signals b11 to b1k (e.g., 1≤k≤m) may be supplied to the first analog-digital conversion units 140-1, 140-2, 140-5, 140-6 . . . 140-m), without being limited thereto.

Based on the selection signals ST11 to ST1m received from the selector 150, a voltage or signal is supplied to the first analog-digital conversion units 140-1, 140-2, 140-5, 140-6, etc., to turn on the first analog-digital conversion units 140-1, 140-2, 140-5, 140-6, etc. On the other hand, the voltage or signal is not supplied to the remaining analog-digital conversion units to turn off the remaining analog-digital conversion units 140-2 to 140-m. Therefore, according to embodiments of the invention, it may be possible to reduce power consumption in the analog-digital conversion block 140.

The outputs of the first analog-digital conversion units 140-1, 140-2, 140-5, 140-6, etc., may be stored in first latches 160-1, 160-2, 160-5, 160-6 . . . 160-m corresponding to the first analog-digital conversion units 140-1, 140-2, 140-5, 140-6, 140-m.

Figure 8:
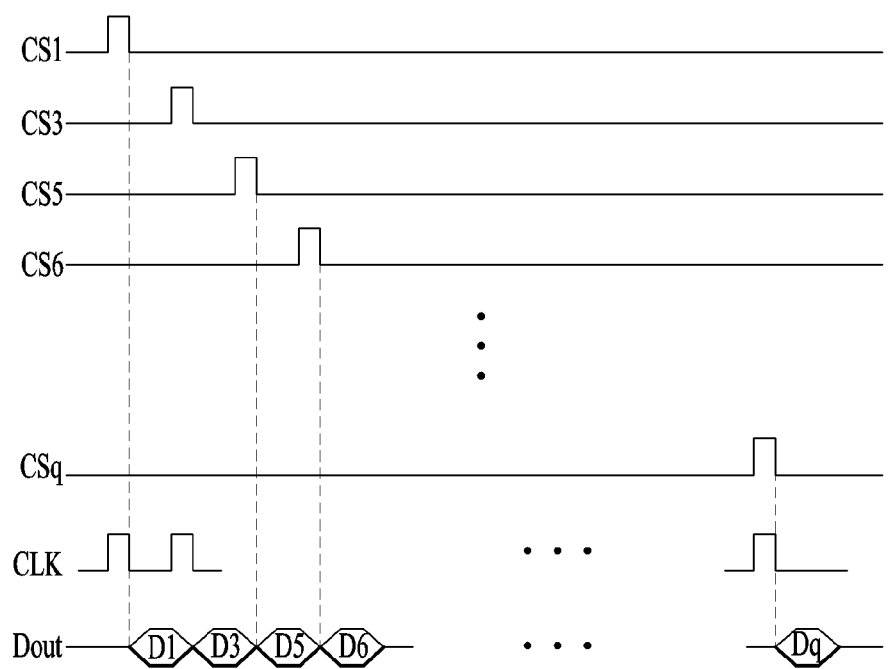
FIG. 8 is a timing diagram of scan signals generated by an exemplary column as scanner shown in FIG. 4.

FIG. 8 is a timing chart of scan signals generated by the exemplary column scanner 170 shown in FIG. 4.

Referring to FIG. 8, the column scanner 170 may generate scan signals CS1, CS2, CS5, CS6 . . . and CSq for reading first latches 160-1, 160-2, 160-5, 160-6 . . . in response to a clock signal CLK.

In response to the scan signals CS1, CS2, CS5, CS6, . . . , data D1, D2, D5, D6, . . . , stored in the first latches 160-1, 160-2, 160-5, 160-6, . . . are sequentially transmitted to the digital signal processor 180. When such data transmission is completed, a scan of one row of the pixel array 120 may be completed.

Since only the first latches 160-1, 160-2, 160-5, 160-6, etc., among the latches of the memory 160 corresponding to one row of the pixel array 120 are read, it may be possible to reduce the time to scan one row by half and to correspondingly increase the frame rate of the image sensor.

The binning sampling unit 130 shown in FIG. 2 may output the signals of the unit pixels belonging to each column of the pixel array 120 to the analog-digital conversion units corresponding to each column. In this case, it may be possible to perform a normal mode process or operation without performing a horizontal binning process or operation by the binning sampling unit 130.

FIG. 5 is a diagram showing a process or an operation according to one or more further embodiments of the image sensor shown in FIG. 1.

Referring to FIG. 5, the binning sampling unit 130c samples the outputs of the unit pixels belonging to each column of the pixel array 120 and outputs sampling signals SP1 to SPm according to the sampled outputs, based on a second control signal BS. FIG. 5 shows a normal process or operation, rather than a binning process or operation.

Each of the plurality of analog-digital conversion units 140-1 to 140-m converts a corresponding analog sampling signals SP1 to SPm to a digital signal.

Each of the plurality of latches 160 stores a corresponding one of the outputs of the plurality of analog-digital conversion units 140-1 to 140-m.

The column scanner 170 reads the data stored in the plurality of latches 160 and transmits the data to the digital signal processor 180.

Figure 6:
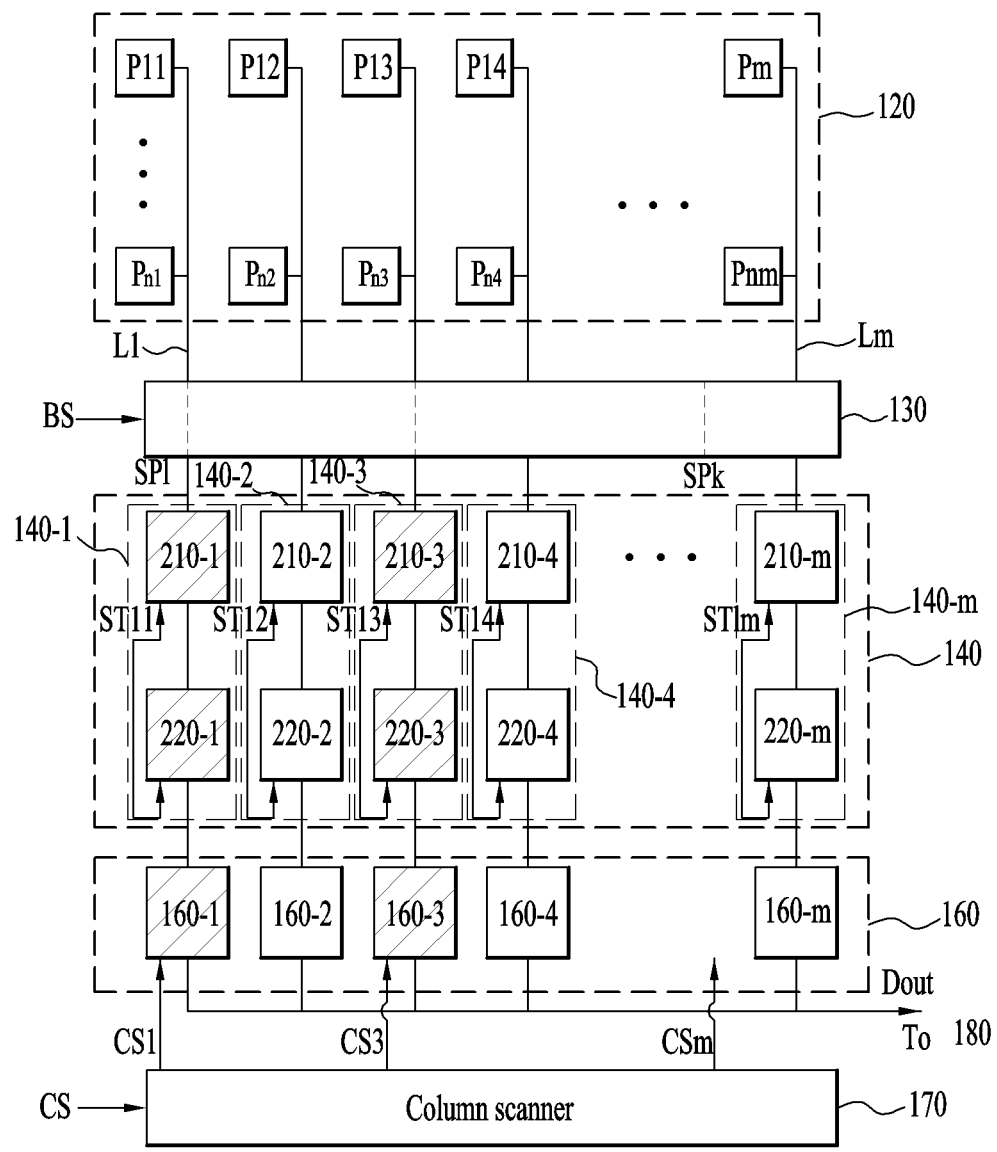
FIG. 6 is a diagram showing an operation according to yet another embodiment of the image sensor shown in FIG. 1.

FIG. 6 is a diagram showing a process or an operation according to one or more further embodiments of the image sensor shown in FIG. 1.

Referring to FIG. 6, the binning sampling unit 130d samples the outputs of the unit pixels belonging to odd-numbered or even-numbered columns of the pixel array 120 and outputs sampling signals SP1 to SPk according to the sampled outputs, based on a second signal BS. FIG. 5 shows a skipping operation.

The odd-numbered or even-numbered analog-digital conversion units may convert corresponding analog sampling signals SP1 to SPk and output the converted digital signal.

The odd-numbered or even-numbered latches store the outputs of the odd-numbered or even-numbered analog-digital conversion units.

The column scanner 170 reads the data stored in the odd-numbered or even-numbered latches and transmits the data to the digital signal processor 180.

The binning sampling unit 130 may include first switches for connecting the sensing lines corresponding to the columns included in the plurality of groups. In addition, the binning sampling unit 130 may include second switches between the sensing lines and the analog-digital conversion units.

In addition, the binning sampling unit 130 may further include third switches between a ground voltage or ground potential and nodes connecting the sensing lines and the analog-digital conversion units.

Figure 9A:
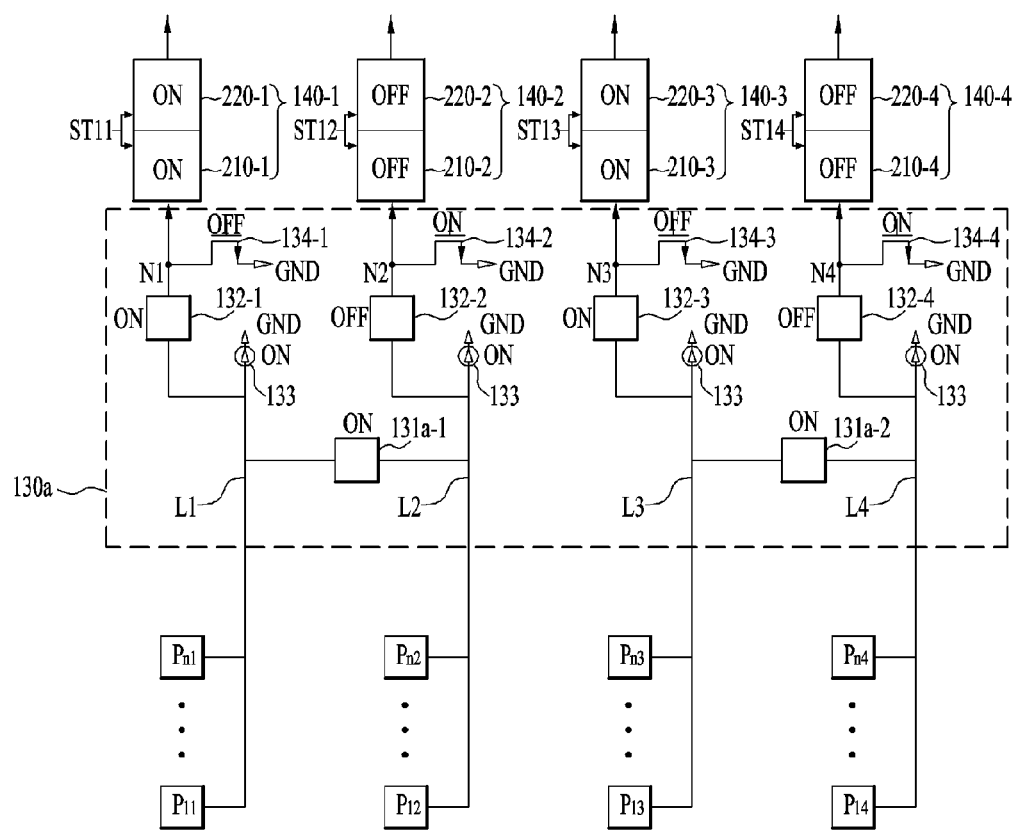
FIG. 9A is a diagram showing ON and/or OFF states of first to third switches and ON and/or OFF states of analog-digital conversion units according to a first exemplary process or operation of the binning sampling unit of FIG. 3.

FIG. 9A is a diagram showing one or more embodiments of the binning sampling unit 130a of FIG. 3.

Referring to FIG. 9A, the binning sampling unit 130a may include first switches 131a-1 to 131a-j (j being a natural number greater than 1) between two adjacent sensing lines L1 and L2, L3 and L4 . . . Lm−1 and Lm, and second switches 132-1 to 132-m between the sensing lines L1 to Lm and the analog digital conversion units 140-1 to 140-m. In addition, the binning sampling unit 130a may include third switches 134-1 to 134-m between the ground voltage or ground potential GND and connection nodes N1 to Nm, which are between the sensing lines L1 to Lm and the analog-digital conversion units 140-1 to 140-m. The binning sampling unit 130a may further include a constant current source 133 between the sensing lines L1 to Lm and the ground voltage or ground potential GND.

For example, each of the first switches 131a-1 to 131a-j (j being a natural number greater than 1) may be between the two different and/or adjacent sensing lines (e.g., L1 and L2, L3 and L4 . . . Lm−1 and Lm) among the sensing lines L1 to Lm.

For example, each of the second switches 132-1 to 132-m may be between a corresponding one of the sensing lines L1 to Lm and a corresponding one of the analog-digital conversion units 140-1 to 140-m (e.g., between sensing line L1 and analog-digital conversion unit 140-1, sensing line L2 and analog-digital conversion unit 140-2, etc.).

For example, each of the third switches 134-1 to 134-m may be between one of the connection nodes N1 to Nm and the ground voltage or ground potential GND.

For example, the constant current source 133 may be between the sensing lines L1 to Lm and the ground voltage or ground potential GND.

FIG. 9A shows the ON and OFF states of the first to third switches and the ON and OFF states of the analog-digital conversion units 140-1 to 140-m according to a first process or operation of the binning sampling unit 130a of FIG. 3. The first process or operation of the binning sampling unit 130a may be a horizontal binning process or operation.

Upon the horizontal binning process or operation, the third switches 134-1 to 134-(m−1) connected to the turned-on analog-digital conversion units 140-1 to 140-(m−1) are turned off. However, the third switches 134-2 to 134-*m* connected to the turned-off analog-digital conversion units 140-2 to 140-*m* are turned on to prevent current leakage.

Figure 9B:
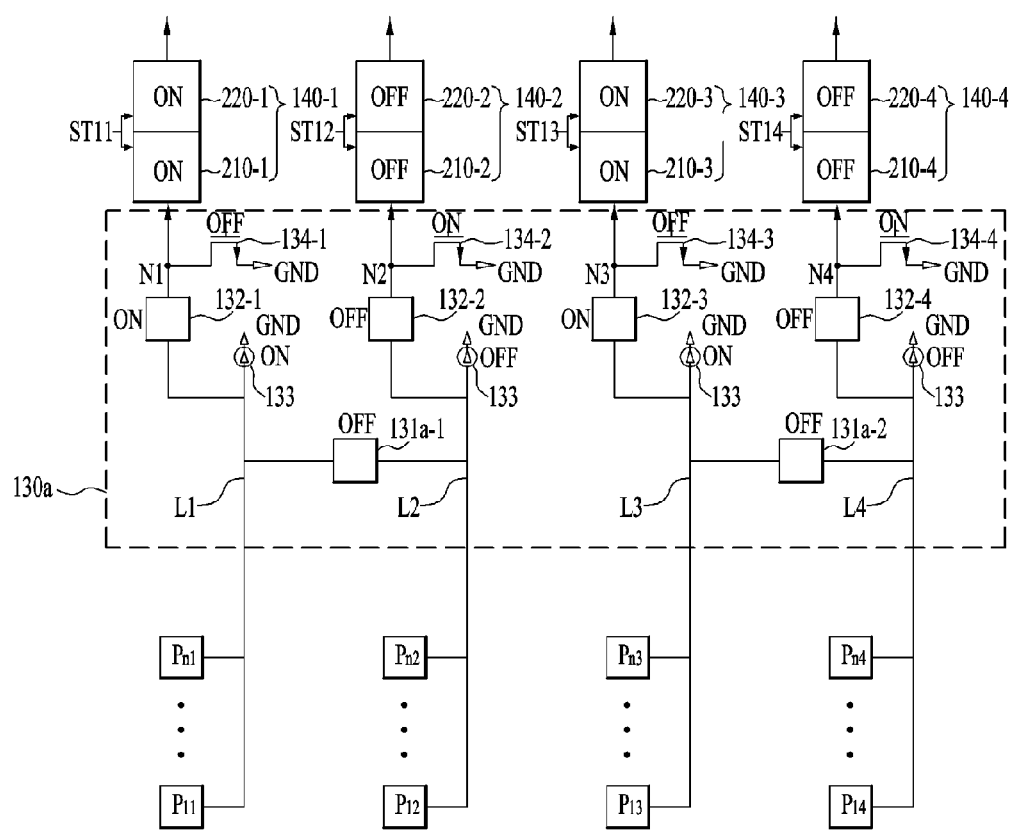
FIG. 9B is a diagram showing ON and/or OFF states of first to third switches and ON and/or OFF states of analog-digital conversion units according to a second exemplary process or operation of the binning sampling unit of FIG. 3.

FIG. 9B is a diagram showing the ON and/or OFF states of the first to third switches and the ON and/or OFF states of the analog-digital conversion units 140-1 to 140-*m* according to a second process or operation of the binning sampling unit 130*a* of FIG. 3. Here, the second process or operation of the binning sampling unit 130*a* may avoid or skip the process or operation for sensing only the odd-numbered or even-numbered columns of the pixel array 120.

The constant current source 133 connected to the turned-off second switches 132-2 to 132-*m* are turned off. According to embodiments of the image sensor, it may be possible to reduce power consumption.

In contrast, in order to sense only the odd-numbered columns, a process or operation opposite to the process or operation for turning on or off the second and third switches, the constant current source and the analog-digital conversion units shown in FIG. 9B may be performed.

In addition, the first switches 131*a*-1 to 131*a*-*j* may all be turned off, the second switches 132-1 to 132-*m* may all be turned on, the third switches 134-1 to 134-*m* may all be turned off, the constant current source 133 may be turned on and the analog-digital conversion units may all be turned on, so that the binning sampling unit 130*a* may perform a normal process or operation.

Figure 10A:
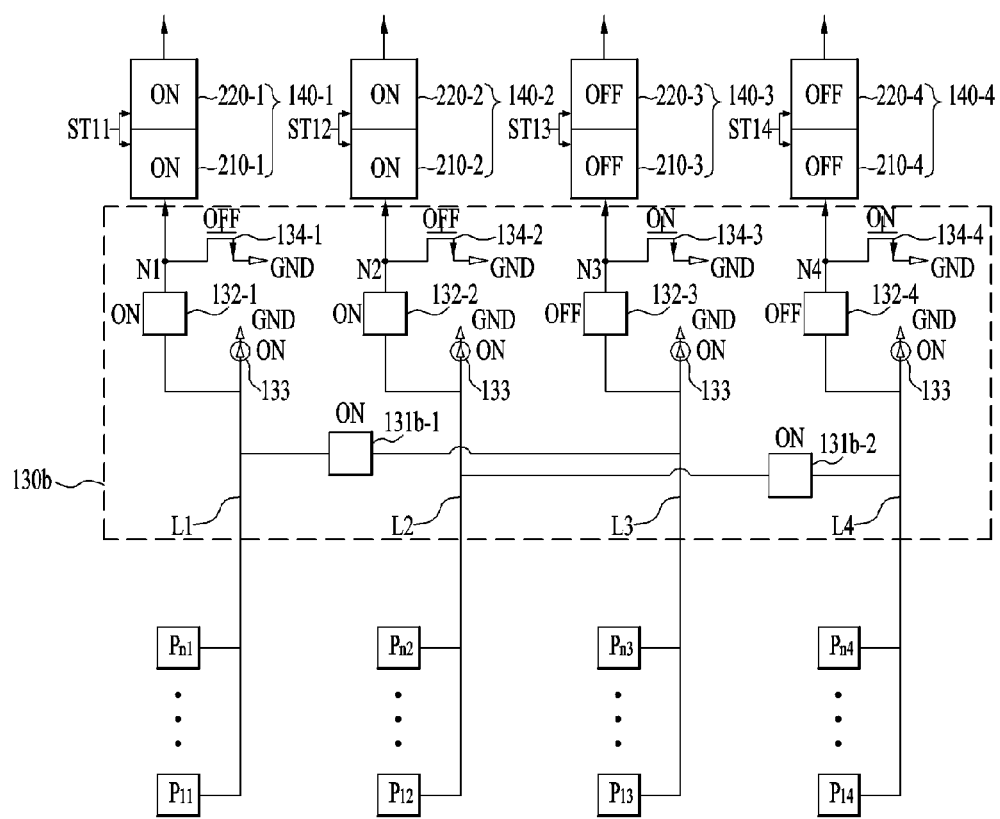
FIG. 10A is a diagram showing ON and/or OFF states of first to third switches and ON and/or OFF states of analog-digital conversion units according to a first exemplary process or operation of the binning sampling unit of FIG. 4.

FIG. 10A is a diagram showing the ON and/or OFF states of the first to third switches and the ON and/or OFF states of analog-digital conversion units 140-1 to 140-*m* according to a first process or operation of the binning sampling unit 130*b* of FIG. 4. The same reference numerals as in FIG. 9A indicate the same components in FIG. 10A, which will be described briefly or omitted. The first process or operation of the binning sampling unit 130*b* may be a horizontal binning process or operation.

The binning sampling unit 130*b* may include first switches 131*b*-1 to 131*b*-*j* (j being a natural number greater than 1), second switches 132-1 to 132-*m*, a constant current source 133, and third switches 134-1 to 134-*m*.

Each of the first switches 131*b*-1 to 131*b*-*j* (j being a natural number greater than 1) are between adjacent odd-numbered sensing lines or between adjacent even-numbered sensing lines.

The description of the ON and OFF states of the first to third switches, the constant current source and the analog-digital conversion units described with reference to FIG. 9A is equally applicable to the first process or operation of the binning sampling unit 130*b*.

Figure 10B:
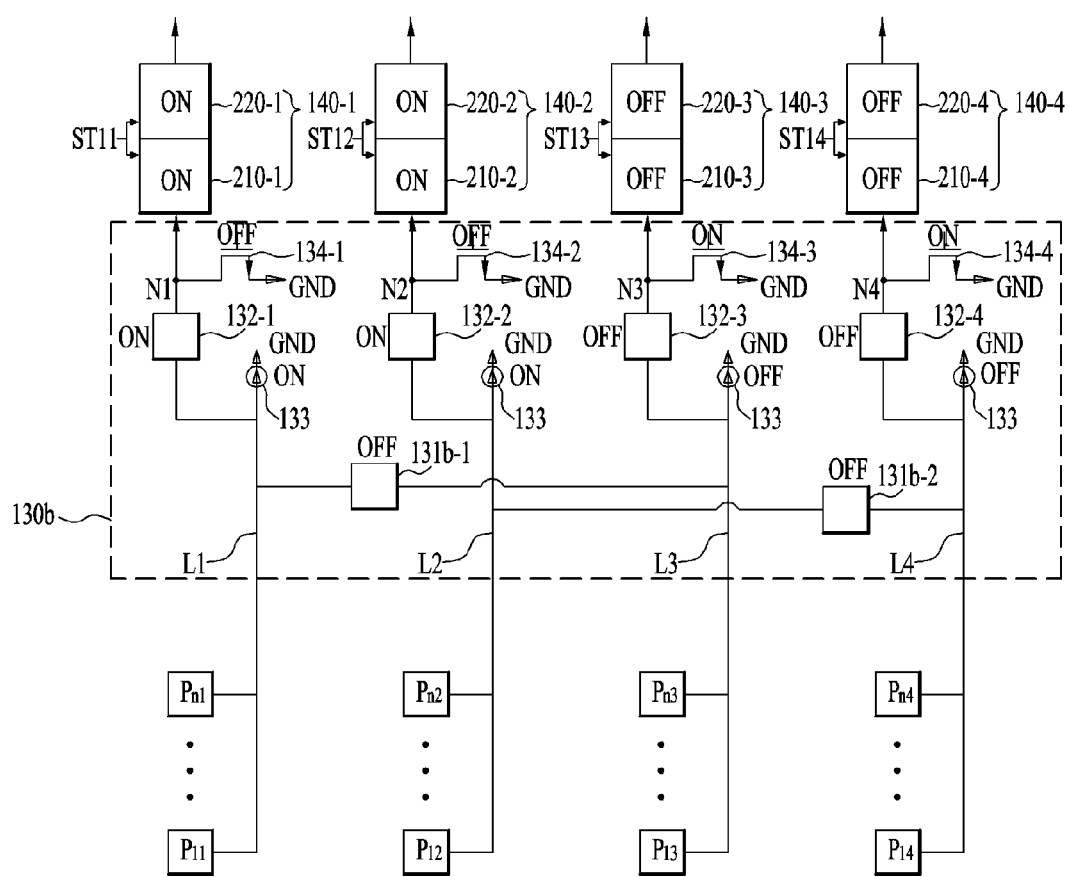
FIG. 10B is a diagram showing ON and/or OFF states of first to third switches and ON and/or OFF states of analog-digital conversion units according to a second exemplary process or operation of the binning sampling unit of FIG. 4.

FIG. 10B is a diagram showing the ON and/or OFF states of the first to third switches and the ON and/or OFF states of analog-digital conversion units 140-1 to 140-*m* according to a second process or operation of the binning sampling unit 130*b* of FIG. 4. The second process or operation of the binning sampling unit 130*b* may avoid or skip an alternate-column sensing operation.

The description of the ON and/or OFF states of the first to third switches, the constant current source and the analog-digital conversion units described with reference to FIG. 9B is equally applicable to the normal process or operation of the binning sampling unit 130B.

Figure 11:
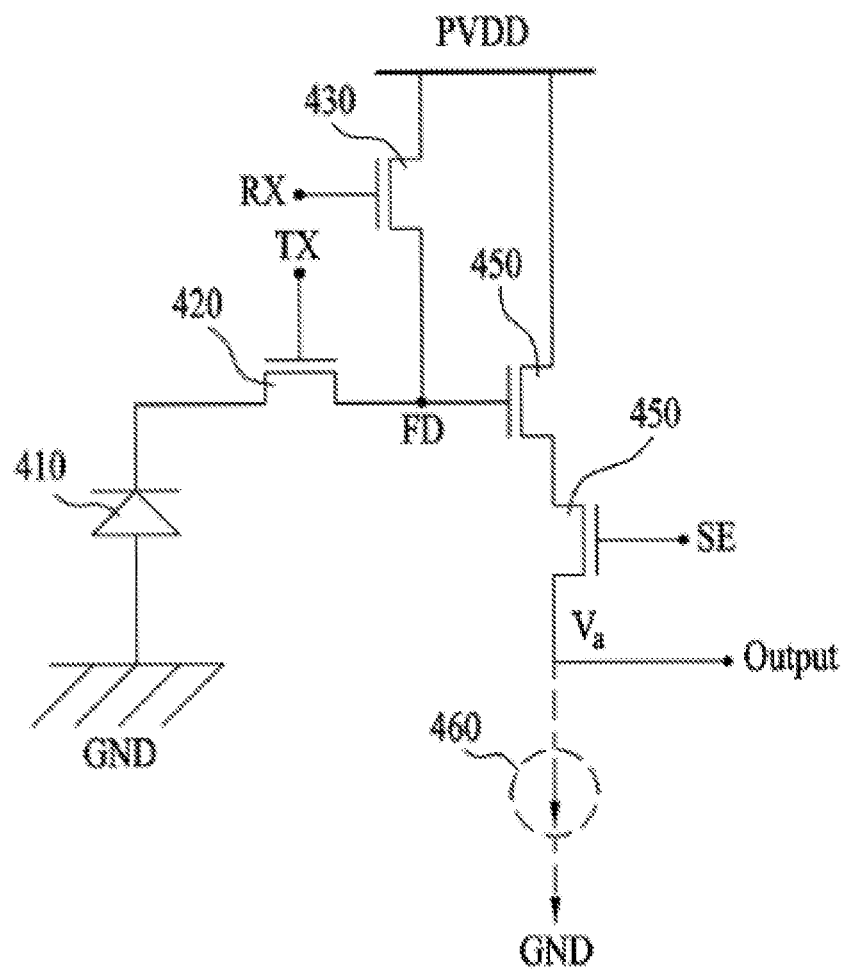
FIG. 11 is a diagram showing an exemplary embodiment of a unit pixel in the pixel array shown in FIG. 1.

FIG. 11 is a diagram showing one or more embodiments of a unit pixel of the pixel array 120 shown in FIG. 1.

Referring to FIG. 11, each of the unit pixels P11 to Pnm of the pixel array 120 may include a photodiode 410, a sense node FD and first to fourth transistors 420 to 450.

For example, the first transistor 420 may be a transfer transistor, the second transistor 430 may be a reset transistor, the third transistor 440 may be a drive transistor and the fourth transistor 450 may be a select transistor. Each of the unit pixels P11 to Pnm may further include a constant current source 460 between the select transistor 450 and a first power supply GND.

The photodiode 410 may be between the first power supply (e.g., ground voltage or ground potential [GND]) and the transfer transistor 420, and may absorb light and generate an electrical charge corresponding to the amount of absorbed light.

The transfer transistor 420 may be between the sense node FD and the photodiode 410 and may transmit charges generated by the photodiode 410 to the sense node FD in response to a transmission signal TX. Here, the sense node FD may be a floating diffusion region.

The reset transistor 430 may be between a second power supply PVDD and may reset the unit pixel in response to a reset signal RX.

The drive transistor 440 may be between the second power supply PVDD and one end (e.g., source or drain) of the select transistor 450 and a gate thereof may be connected to the sense node FD. The drive transistor 440 may output a signal in response to the voltage on the sense node FD, and may be configured as a source follower in combination with the constant current source 450.

The select transistor 450 may be between the drive transistor 440 and the sensing line and outputs a sense signal Va to an output terminal connected to the sensing line in response to a selection signal SE. The sense signal Va may be output on the output terminal in accordance with the sensed charges from the photodiode 410.

Figure 12:
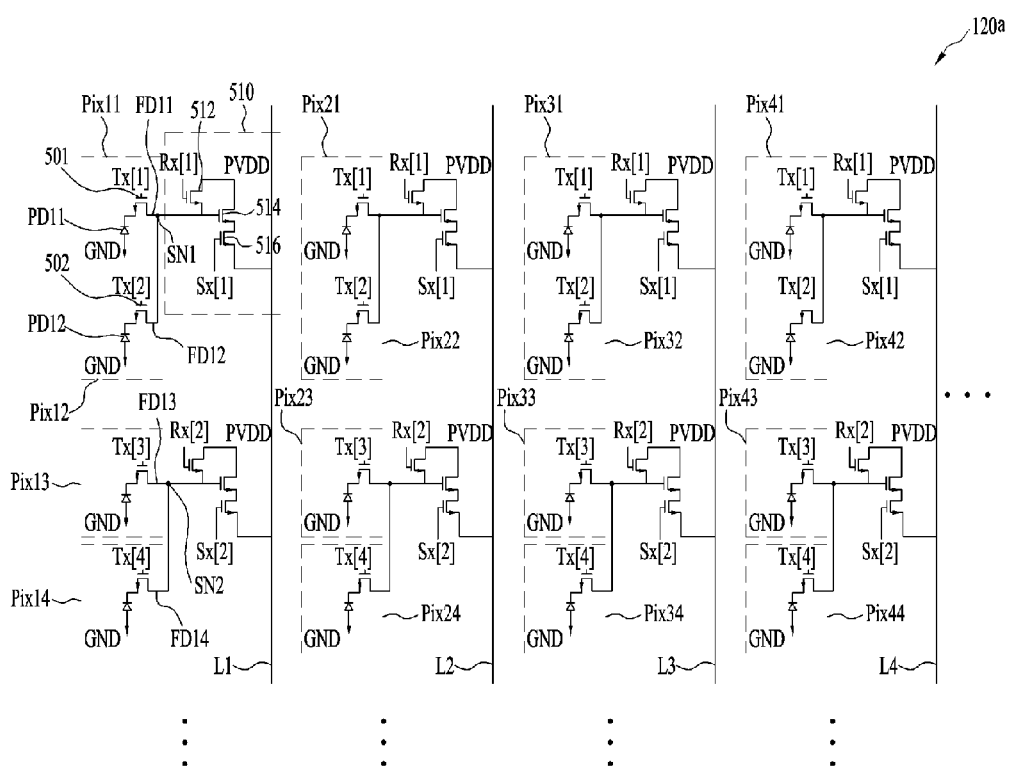
FIG. 12 is a diagram showing another embodiment of the pixel array shown in FIG. 1.

FIG. 12 is a diagram showing an embodiment of the pixel array 120*a* as shown in FIG. 1.

Referring to FIG. 12, the pixel array 120*a* includes a plurality of unit pixels (e.g., Pix11 to Pix44) and a readout circuit 510.

The plurality of unit pixels (e.g., Pix11 to Pix44) may be in a matrix including rows and columns. Each of the unit pixels (e.g., Pixx11 to Pix44) may have the same structure.

For example, the unit pixel (e.g., Pix11) may include a photodiode PD11, a floating diffusion area FD11 and a transfer transistor 501 between the photodiode and the floating diffusion area FD11 to transmit charges from the photodiode PD11 to the floating diffusion area FD11.

The floating diffusion areas of two or more different unit pixels in each column of the pixel array 120*a* are connected to each other. The floating diffusion areas connected to and shared between each other are referred to as "shared sense nodes SN1 and SN2".

That is, the unit pixels in each column may be grouped into a plurality of subgroups, and each of the plurality of subgroups may include two or more different unit pixels. The plurality of subgroups may be sequentially driven.

The floating diffusion areas FD11 and FD12, FD13 and FD14 of the unit pixels in the plurality of subgroups are connected to and shared between each other.

For example, each of the subgroups may include two different adjacent unit pixels in each column of the pixel array 120*a*.

The readout circuit 510 connects the shared floating diffusion areas and a corresponding one of the sensing lines.

The readout circuit 510 may include a reset transistor 512, a drive transistor 514 and a select transistor 516.

The reset transistor 512 may be between the second power supply PVDD and the shared sense node to reset the unit pixel in response to a reset signal RX.

The drive transistor 514 may be between the second power supply PVDD and one end (e.g., source or drain) of the select transistor 450 and have a gate connected to the sense node FD.

The select transistor 516 is between the drive transistor 514 and the sensing line to output a sense signal to the sensing line in response to a selection signal SE.

Figure 13A:
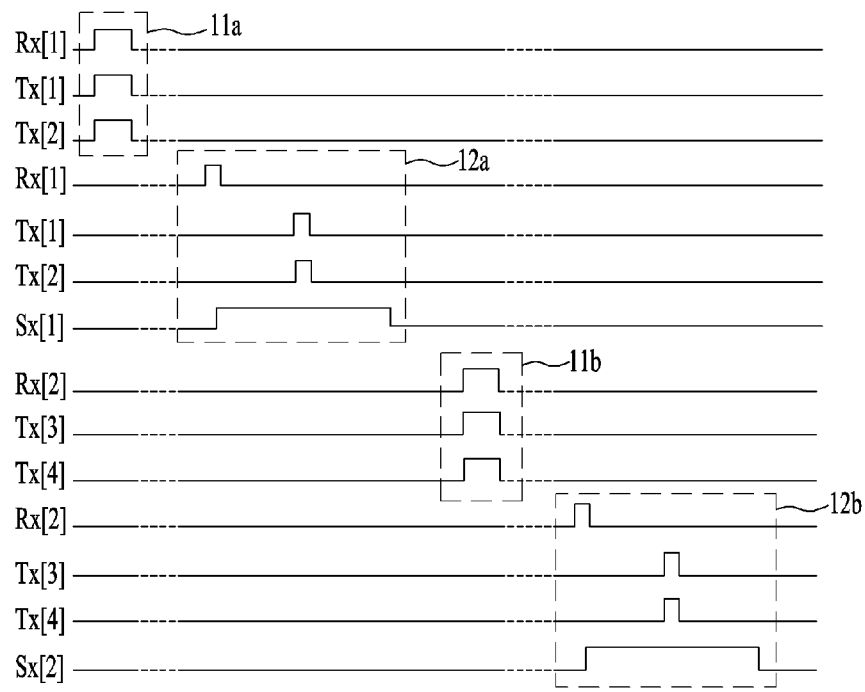
FIG. 13A is a timing diagram showing an exemplary process or operation of the pixel array of FIG. 12 in a first driving mode.

FIG. 13A is a timing diagram showing a process or an operation of the pixel array 120a as shown in FIG. 12 in a first driving mode. Here, the first driving mode may be a vertical binning mode.

Referring to FIG. 13A, the unit pixels (e.g., Pix11 and Pix12, or Pix13 and Pix14) sharing a shared sense node (e.g., SN1 or SN2) are simultaneously refreshed, as shown by the dashed-line boxes.

After completing the refresh operation, a correlated double sampling (CDS) process or operation may be performed with reference to the unit pixels (e.g., Pix11 and Pix12, Pix13 and Pix14, etc.) sharing the shared sense node (e.g., SN1 or SN2), as shown by the dashed-line boxes 12a and 12b.

After resetting the reset transistor 512, the transfer transistors (e.g., 501 and 502) of the unit pixels (e.g., Pix11 and Pix12) are simultaneously turned on.

For example, after turning the reset transistor 512 of the readout circuit 510 on in response to the reset signal RX[1], the select transistor 516 may be turned on in response to the selection signal SX[1], and the first and second transfer transistors 501 and 502 may be simultaneously turned on in response to the first and second transmission signals TX[1] and TX[2] when the select transistor 516 is on.

In FIG. 13A, since two rows are simultaneously sensed, embodiments of the present image sensor may improve the readout speed of the image sensor. Since two unit pixels share one readout circuit, it may be possible in the same layout area of the pixel array, to increase the area of the photodiode, as compared to the single pixel structure of FIG. 11.

The description of the unit pixels Pix11 and Pix12 and/or processes or operations thereof is equally applicable to the refresh process or operation and the CDS sampling process or operation of the unit pixels sharing different shared sense nodes.

Figure 13B:
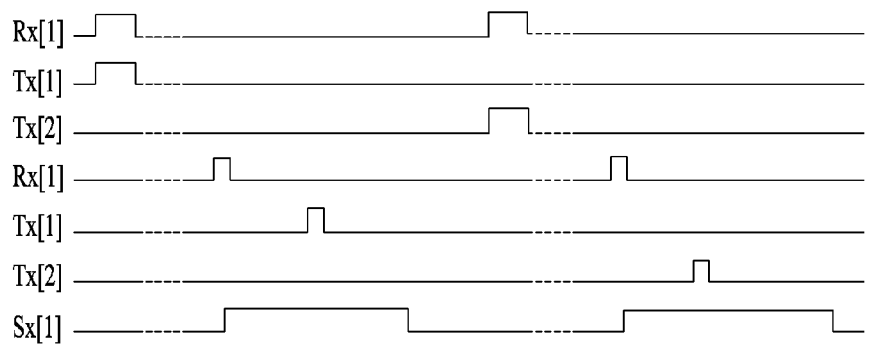
FIG. 13B is a timing diagram showing an exemplary process or operation of the pixel array of FIG. 12 in a second driving mode.

FIG. 13B is a timing chart showing a process or an operation of the pixel array 120a shown in FIG. 12 in a second driving mode. Here, the second driving mode may be a normal mode without a vertical binning process or operation.

Referring to FIG. 13B, the transfer transistors 501 and 502 of the unit pixels Pix11 and Pix12 in which the floating diffusion areas (e.g., FD11 and FD12) are connected to each other may be sequentially turned on in response to second transmission signals TX[1] and TX[2].

Figure 14:
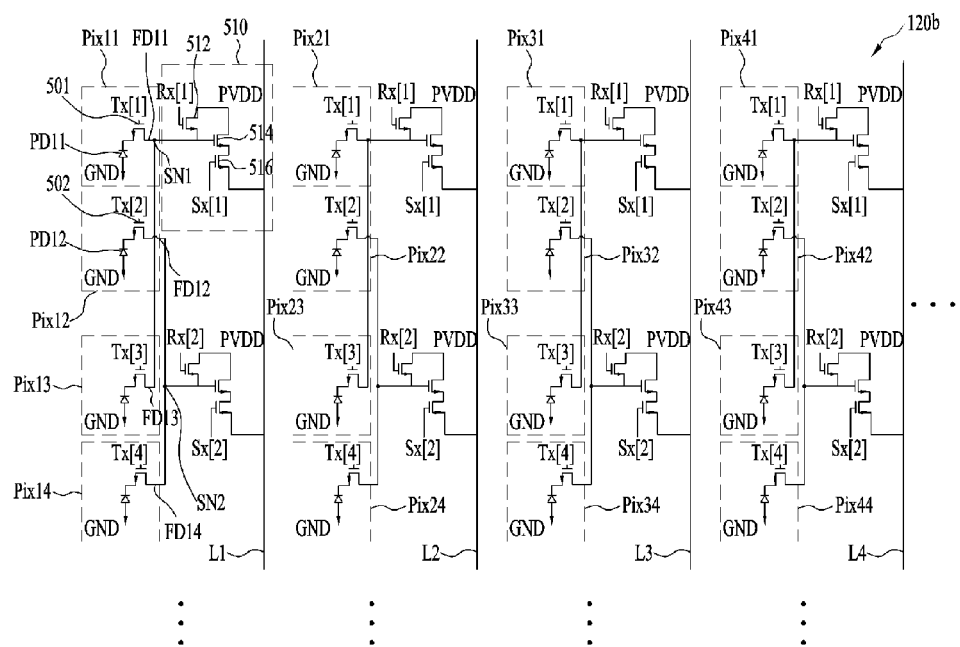
FIG. 14 is a diagram showing another embodiment of the pixel array shown in FIG. 1.

FIG. 14 is a diagram showing another embodiment 120b of the pixel array 120 as shown in FIG. 1. The same reference numerals as in FIG. 12 indicate the same components in FIG. 14, which will be described briefly or omitted.

Referring to FIG. 14, the pixel array 120b includes a plurality of unit pixels (e.g., Pix11 to Pix44) and a readout circuit 510. The configuration or arrangement of the plurality of unit pixels in a matrix is to the same as that of FIG. 12.

The unit pixels in each column may be grouped into a plurality of subgroups, and each of the plurality of subgroups may include two or more different unit pixels. The plurality of subgroups may be sequentially driven. The floating diffusion areas FD11 and FD13 or FD12 and FD14 of the unit pixels in a given subgroups are connected to and shared between each other.

For example, the plurality of subgroups may include first subgroups and second subgroups.

Each of the first subgroups may include unit pixels of two or more different odd-numbered rows of each column, and each of the second subgroups may include unit pixels of two or more different even-numbered rows of each column.

For example, each of the first subgroups may include unit pixels of two different adjacent odd-numbered rows of each column, and each of the second subgroups may include unit pixels of two different adjacent even-numbered rows of each column.

The floating diffusion areas of the unit pixels in each of the first subgroups may be connected to and shared between each other, and the floating diffusion areas of the unit pixels in each of the second subgroups may be connected to and shared between each other. The floating diffusion areas connected to and shared between each other may be referred to as "shared sense nodes SN1 and SN2".

The readout circuit 510 may be between the shared sense node (e.g., SN1 or SN2) and the sensing line (e.g., L1).

Figure 15A:
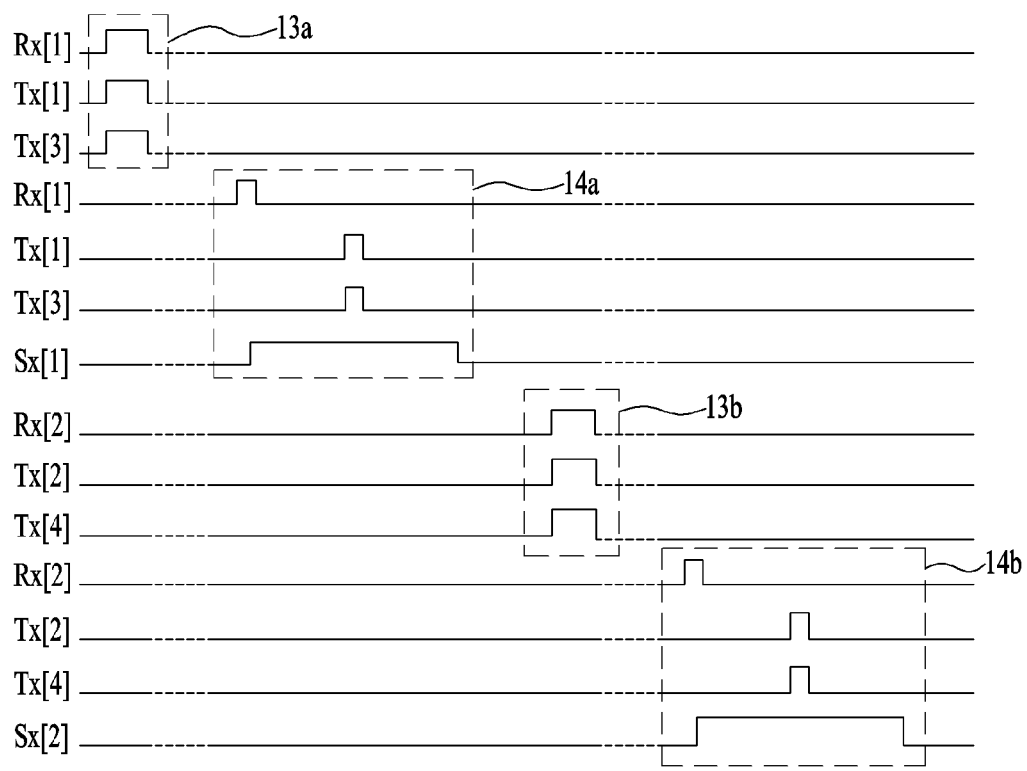
FIG. 15A is a timing diagram showing an exemplary process or operation of the pixel array diagram of FIG. 14 in a first driving mode.
Figure 15B:
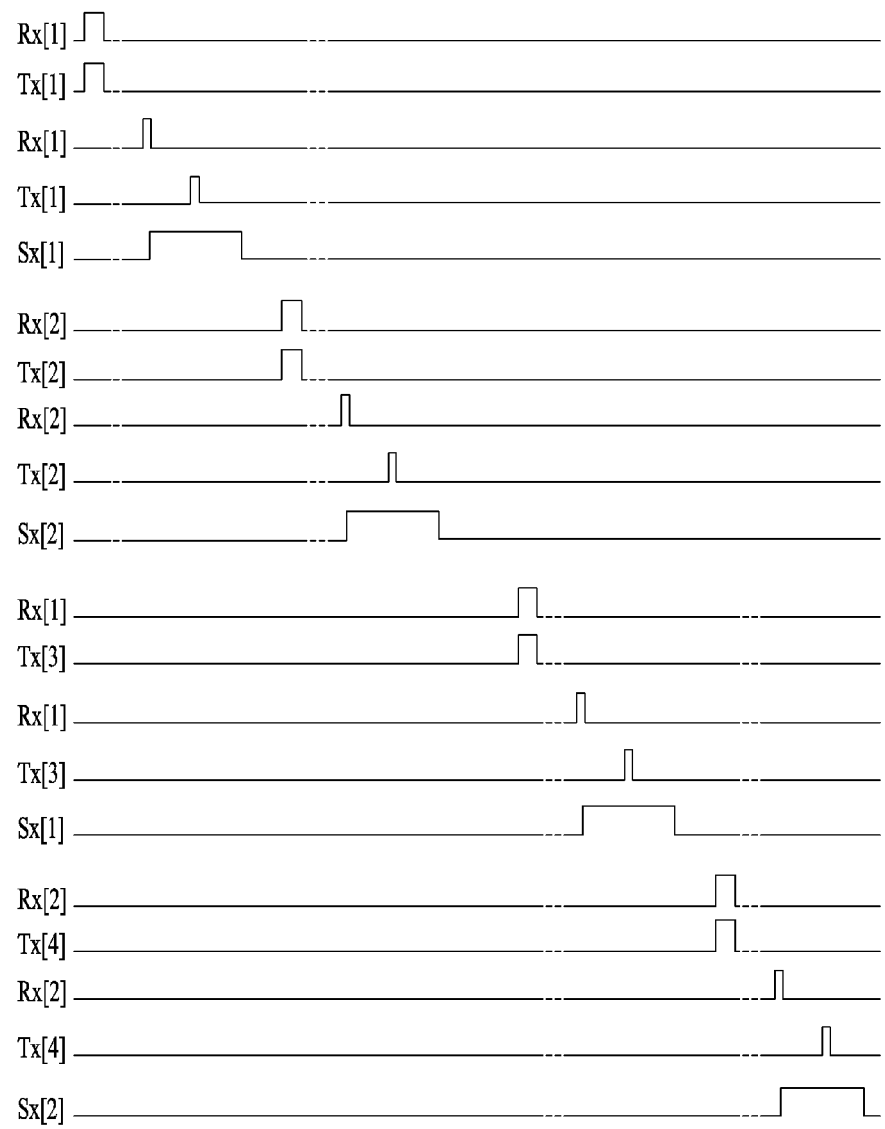
FIG. 15B is a timing chart showing an exemplary process or operation of the pixel array of FIG. 14 in a second driving mode.

FIG. 15A is a timing diagram showing an exemplary process or operation of the pixel array 120b shown in FIG. 14 in a first driving mode, and FIG. 15B is a timing diagram showing an exemplary process or operation of the pixel array 120b shown in FIG. 14 in a second driving mode. The first driving mode may be a vertical binning mode, and the second driving mode may be a normal mode.

Referring to FIGS. 15A and 15B, the unit pixels (e.g., Pix11 and Pix13, or Pix12 and Pix14) sharing the shared sense node (e.g., SN1 or SN2) are simultaneously refreshed, as indicated by the dashed-lines boxes 13a and 13b.

After completing the refresh operation, a CDS sampling process or operation may be performed with reference to the unit pixels (e.g., Pix11 and Pix13 or Pix12 and Pix14) sharing the shared sense node (e.g., SN1 or SN2), as indicated by the dashed-line boxes 14a and 14b.

In the first driving mode, the transfer transistors 501 and 503 of the unit pixels Pix11 and Pix13 of the odd-numbered rows are simultaneously turned on in response to the transmission signals TX[1] and TX[3], and the transfer transistors 502 and 504 of the unit pixels Pix12 and Pix14 of the even-numbered rows are simultaneously turned on in response to the transmission signals TX[2] and TX[4].

As described above, according to this embodiment, it may be possible to reduce power consumption of the analog-digital conversion block and to advantageously increase the frame rate of the image sensor.

Features, structures, effects, and the like as described above in the above embodiments are included in at least one embodiment of the present invention and should not be limited to only one embodiment. In addition, the features, structures, effects, and the like described in the respective embodiments may be combined or modified even with respect to the other embodiments by those skilled in the art. Accordingly, contents related to these combinations and modifications should be construed as within the scope of the present invention.

What is claimed is:
1. An image sensor comprising:
   a pixel array including a plurality of unit pixels in a matrix including rows and columns, the matrix being divided into a plurality of groups, each of the plurality of groups including two or more different columns;
a binning sampling unit configured to sample outputs of unit pixels in each of the plurality of groups and output binning sampling signals; and
an analog-digital conversion block including a plurality of analog-digital conversion units corresponding to the columns, the analog-digital conversion units having first and second analog-digital conversion units, wherein each of the plurality of analog-digital conversion units includes (i) a correlated double sampling unit configured to perform correlated double sampling and (ii) an analog-digital converter configured to convert an output of the correlated double sampling unit, and the first analog-digital conversion units are configured to convert the binning sampling signals,
wherein when the first analog-digital conversion units convert the binning sampling signals, the correlated double sampling unit and the analog-digital converter of each of the second analog-digital conversion units are off.

2. The image sensor according to claim 1, wherein each of the plurality of groups includes two or more adjacent columns.

3. The image sensor according to claim 1, wherein:
the plurality of groups includes first and second groups, and
each of the first groups includes two or more adjacent odd-numbered columns, and each of the second group includes two or more adjacent even-numbered columns.

4. The image sensor according to claim 1, wherein the pixel array includes sensing lines connected to the binning sampling unit, and each of the sensing lines is connected to a corresponding unit pixel in a corresponding one of the columns.

5. The image sensor according to claim 4, wherein the binning sampling unit includes:
first switches configured to connect sensing lines corresponding to columns in each of the plurality of groups; and
second switches between the sensing lines and the analog-digital conversion units.

6. The image sensor according to claim 5, wherein the binning sampling unit further includes third switches between a ground voltage or a ground potential and nodes between the sensing lines and the analog-digital conversion units.

7. The image sensor according to claim 1, further comprising a selector configured to turn the first analog-digital conversion units on and turn the second analog-digital conversion units off.

8. The image sensor according to claim 1, further comprising a memory including a plurality of latches configured to store outputs of the analog-digital conversion units.

9. The image sensor according to claim 8, further comprising a column scanner configured to select first ones of the latches corresponding to the first analog-digital conversion units and read digital data in the selected first latches.

10. An image sensor comprising:
a pixel array including a plurality of unit pixels in a matrix including rows and columns, the matrix being divided into a plurality of groups, and each of the plurality of groups including two or more different columns;
a binning sampling unit configured to sample outputs of unit pixels that belong to each of the plurality of groups and output binning sampling signals;
an analog-digital conversion block including a plurality of analog-digital conversion units that correspond to the columns, the analog-digital conversion units comprising first analog-digital conversion units configured to convert the binning sampling signals;
latches configured to store outputs of the plurality of analog-digital conversion units; and
a column scanner configured to select first ones of the latches to store outputs of the first analog-digital conversion units and read digital data in the selected first latches.

11. The image sensor according to claim 10, wherein each of the plurality of groups includes two or more adjacent columns.

12. The image sensor according to claim 10, wherein:
the plurality of groups includes first and second groups, and
each of the first groups includes two or more adjacent odd-numbered columns and each of the second groups includes two or more adjacent even-numbered columns.

13. The image sensor according to claim 10, wherein the column scanner generates scan signals configured to select the first latches and sequentially read the data in the first latches in response to the scan signals.

14. The image sensor according to claim 10, wherein each of the unit pixels includes a photodiode, a floating diffusion area, a transfer transistor, a reset transistor, a drive transistor and a select transistor.

15. An image sensor comprising:
a pixel array including a plurality of unit pixels in a matrix including rows and columns, sensing lines, and readout circuits between the plurality of unit pixels and the sensing lines, the matrix being divided into a plurality of groups, and each of the plurality of groups including two or more different columns;
a binning sampling unit configured to sample outputs of unit pixels in each of the plurality of groups and output binning sampling signals; and
an analog-digital conversion block including a plurality of analog-digital conversion units corresponding to the columns, the analog-digital conversion units comprising first analog-digital conversion units configured to convert the binning sampling signals,
wherein each of the unit pixels includes a photodiode, a floating diffusion area and a transfer transistor between the photodiode and the floating diffusion area, the unit pixels in each column are grouped into a plurality of subgroups, and the floating diffusion areas of the unit pixels in each of the plurality of subgroups are connected to and shared between each other, and
the readout circuit connects the shared floating diffusion areas and a corresponding one of the sensing lines.

16. The image sensor according to claim 15, wherein when the first analog-digital conversion units convert the binning sampling signals, the second analog-digital conversion units are off.

17. The image sensor according to claim 15, further comprising:
latches configured to store outputs of the plurality of analog-digital conversion units; and
a column scanner configured to select first ones of the latches to store the outputs of the first analog-digital conversion units and read digital data in the selected first latches.

18. The image sensor according to claim 15, wherein each of the plurality of subgroups includes two or more adjacent unit pixels.

19. The image sensor according to claim 15, wherein:
the plurality of subgroups includes first and second subgroups, each of the first subgroups includes unit pixels of two or more adjacent odd-numbered rows of each column, and
each of the second subgroups includes unit pixels of two or more adjacent even-numbered rows of each column.

* * * * *